(12) United States Patent
Wang

(10) Patent No.: US 8,643,000 B2
(45) Date of Patent: Feb. 4, 2014

(54) ORGANIC ELECTRONIC DEVICE WITH LOW-REFLECTANCE ELECTRODE

(75) Inventor: Ying Wang, Wilmington, DE (US)

(73) Assignee: E I du Pont de Nemours and Company, Wilmington, DE (US)

(*) Notice: Subject to any disclaimer, the term of this patent is extended or adjusted under 35 U.S.C. 154(b) by 572 days.

(21) Appl. No.: 12/621,023

(22) Filed: Nov. 18, 2009

(65) Prior Publication Data

US 2010/0181556 A1    Jul. 22, 2010

Related U.S. Application Data

(60) Provisional application No. 61/115,679, filed on Nov. 18, 2008.

(51) Int. Cl.
*H01L 29/08* (2006.01)

(52) U.S. Cl.
USPC ............................ 257/40; 257/79; 257/103

(58) Field of Classification Search
USPC ............................................. 257/40, 79, 103
See application file for complete search history.

(56) References Cited

U.S. PATENT DOCUMENTS

| | | | |
|---|---|---|---|
| 5,986,401 A | 11/1999 | Thompson et al. | |
| 6,040,056 A | 3/2000 | Anzaki et al. | |
| 6,114,715 A | 9/2000 | Hamada | |
| 6,232,714 B1 | 5/2001 | Shen et al. | |
| 6,303,238 B1 | 10/2001 | Thompson et al. | |
| 6,307,528 B1 | 10/2001 | Yap | |
| 6,411,019 B1 | 6/2002 | Hofstra et al. | |
| 6,476,783 B2 | 11/2002 | Matthies et al. | |
| 6,518,700 B1 | 2/2003 | Friend et al. | |
| 6,608,333 B1 | 8/2003 | Lee et al. | |
| 6,635,364 B1 | 10/2003 | Igarashi | |
| 6,670,645 B2 * | 12/2003 | Grushin et al. | 257/98 |
| 6,750,609 B2 | 6/2004 | Aziz et al. | |
| 6,781,293 B2 | 8/2004 | Cho | |
| 6,841,932 B2 | 1/2005 | Aziz et al. | |
| 2002/0030193 A1 | 3/2002 | Yamazaki | |
| 2002/0039871 A1 | 4/2002 | Hofstra | |
| 2002/0043928 A1 | 4/2002 | Cho | |
| 2002/0057053 A1 | 5/2002 | Hitoshi | |
| 2002/0153834 A1 | 10/2002 | Hofstra | |
| 2002/0195932 A1 | 12/2002 | Steckl | |

(Continued)

FOREIGN PATENT DOCUMENTS

| | | |
|---|---|---|
| CN | 1519618 A | 8/2004 |
| EP | 372763 A2 | 7/1996 |

(Continued)

OTHER PUBLICATIONS

"Flexible light-emitting diodes made from soluble conducting polymer," Nature vol. 357, pp. 477 479 (Jun. 11, 1992).

(Continued)

*Primary Examiner* — Long Pham

(57) ABSTRACT

There is provided an organic electronic device including an anode; a hole injection layer; a hole transport layer; a photoactive layer including a plurality of first subpixels, a plurality of second subpixels and a plurality of third subpixels; an electron transport layer including an electron transport material and an n-dopant, the layer having a thickness greater than 50 nm; and a cathode. One of the anode and cathode is light-transmitting and the other has low-reflectance.

9 Claims, 10 Drawing Sheets

(56) References Cited

U.S. PATENT DOCUMENTS

| | | |
|---|---|---|
| 2003/0035978 A1 | 2/2003 | Raychaudhuri et al. |
| 2003/0038593 A1 | 2/2003 | Aziz et al. |
| 2003/0234608 A1 | 12/2003 | Lee et al. |
| 2004/0102577 A1 | 5/2004 | Hsu et al. |
| 2004/0127637 A1 | 7/2004 | Hsu et al. |
| 2004/0140757 A1 | 7/2004 | Tyan et al. |
| 2004/0140758 A1 | 7/2004 | Raychaudhuri et al. |
| 2004/0178436 A1 | 9/2004 | Baniecki et al. |
| 2004/0256978 A1 | 12/2004 | Yu et al. |
| 2005/0052119 A1 | 3/2005 | Yu et al. |
| 2005/0184287 A1* | 8/2005 | Herron et al. .................. 257/40 |
| 2005/0205860 A1 | 9/2005 | Hsu et al. |
| 2005/0225230 A1 | 10/2005 | Takeda et al. |
| 2007/0034862 A1* | 2/2007 | Parham et al. ................. 257/40 |
| 2008/0061679 A1 | 3/2008 | Xu |

FOREIGN PATENT DOCUMENTS

| | | |
|---|---|---|
| EP | 845925 A2 | 6/1998 |
| EP | 1160890 A2 | 12/2001 |
| EP | 1223618 A2 | 7/2002 |
| JP | 10255978 A | 9/1998 |
| WO | 9810621 A1 | 3/1998 |
| WO | 0035028 A1 | 6/2000 |
| WO | 00/70655 A1 | 11/2000 |
| WO | 0065670 A1 | 11/2000 |
| WO | 01/41512 A1 | 6/2001 |
| WO | 03/008424 A1 | 1/2003 |
| WO | 03005776 A1 | 1/2003 |
| WO | 03/040257 A1 | 5/2003 |
| WO | 03/063555 A1 | 7/2003 |
| WO | 03/091688 A2 | 11/2003 |
| WO | 2004/016710 A1 | 2/2004 |
| WO | 2005/052027 A1 | 6/2005 |
| WO | 2005096403 A2 | 10/2005 |

OTHER PUBLICATIONS

Kirk-Othmer Encyclopedia of Chemical Technology, Fourth Edition, vol. 18, p. 837-860, 1996, by Y. Wang.

ISR 20080211; International Search Report for PCT Application No. PCT/US2006/48230; Lee W. Young, Authorized Officer; Feb. 11, 2008.

EESR Nov. 5, 2010; Extended European Search Report for Application No. EP06845715.9; Nov. 5, 2010.

* cited by examiner

ORGANIC ELECTRONIC DEVICE WITH LOW-REFLECTANCE ELECTRODE

RELATED APPLICATION

This application claims priority under 35 U.S.C. §119(e) from Provisional Application No. 61/115,679 filed on Nov. 18, 2008, which is incorporated by reference in its entirety.

BACKGROUND INFORMATION

1. Field of the Disclosure

This disclosure relates in general to organic electronic devices and particularly to device architecture including a low-reflectance electrode.

2. Description of the Related Art

In organic electronic devices, such as organic light emitting diodes ("OLED"), that make up OLED displays, the organic active layer is sandwiched between two electrical contact layers. In an OLED, at least one of the electrical contact layers is light-transmitting, and the organic active layer emits light through the light-transmitting electrical contact layer upon application of a voltage across the electrical contact layers.

It is well known to use organic electroluminescent compounds as the active component in light-emitting diodes. Simple organic molecules, conjugated polymers, and organometallic complexes have been used. Devices frequently include one or more charge transport layers, which are positioned between a photoactive (e.g., light-emitting) layer and an electrical contact layer. A device can contain two or more contact layers. A hole transport layer can be positioned between the photoactive layer and the hole-injecting contact layer. The hole-injecting contact layer may also be called the anode. An electron transport layer can be positioned between the photoactive layer and the electron-injecting contact layer. The electron-injecting contact layer may also be called the cathode. Charge transport materials can also be used as hosts in combination with the photoactive materials.

There is a continuing need for devices with improved properties.

SUMMARY

There is provided an organic electronic device comprising:
an anode;
a hole injection layer;
a hole transport layer;
a photoactive layer comprising a plurality of first subpixels, a plurality of second subpixels and a plurality of third subpixels;
an electron transport layer comprising an electron transport material and an n-dopant, the layer having a thickness greater than 50 nm; and
a cathode,
wherein one of the anode and cathode is light-transmitting and the other has low-reflectance.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1:
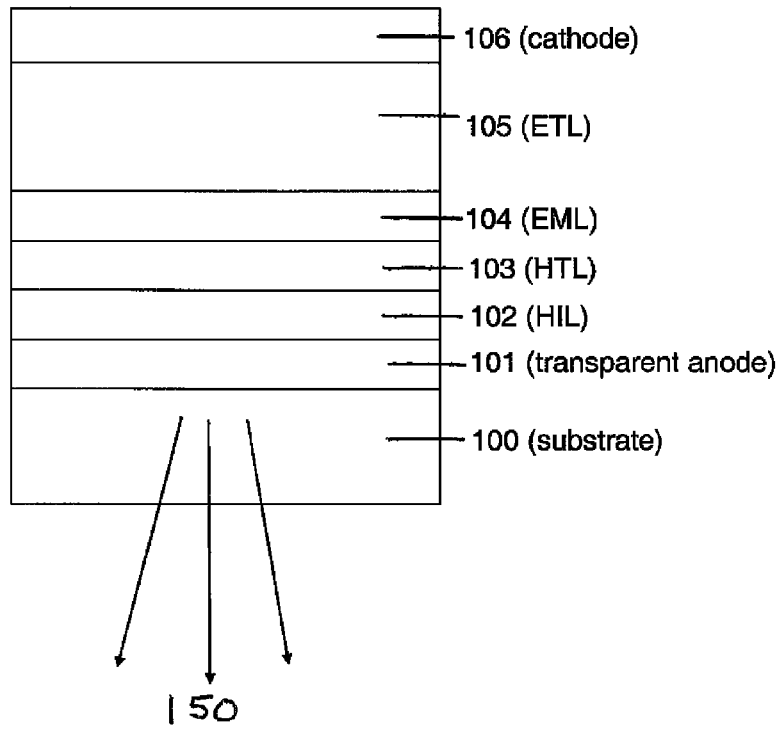
FIG. 1 includes an illustration of one example of an organic electronic device.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms, followed by the Electronic Device and Examples.

1. Definitions and Clarification of Terms

Before addressing details of embodiments described below, some terms are defined or clarified.

The term "blue" is intended to mean radiation that has an emission maximum at a wavelength in a range of approximately 400-500 nm.

The term "charge transport," when referring to a layer, material, member, or structure is intended to mean such layer, material, member, or structure facilitates migration of such charge through the thickness of such layer, material, member, or structure with relative efficiency and small loss of charge. Hole transport materials facilitate positive charge; electron transport material facilitate negative charge. Although light-emitting materials may also have some charge transport properties, the term "charge transport layer, material, member, or structure" is not intended to include a layer, material, member, or structure whose primary function is light emission or light absorption.

The term "dopant" is intended to mean a material, within a layer including a host material, that changes the wavelength(s) of radiation emission of the layer compared to the wavelength(s) of radiation emission in the absence of such material. A dopant of a given color refers to a dopant which emits light of that color.

The term "green" is intended to mean radiation that has an emission maximum at a wavelength in a range of approximately 500-580 nm.

The term "host material" is intended to mean a material, usually in the form of a layer, to which a dopant may or may not be added. The host material may or may not have electronic characteristic(s) or the ability to emit, receive, or filter radiation. When a dopant is present in a host material, the host material does not significantly change the emission wavelength of the dopant material.

The term "liquid composition" is intended to mean a liquid medium in which a material is dissolved to form a solution, a liquid medium in which a material is dispersed to form a dispersion, or a liquid medium in which a material is suspended to form a suspension or an emulsion.

The term "liquid medium" is intended to mean a liquid material, including a pure liquid, a combination of liquids, a solution, a dispersion, a suspension, and an emulsion. Liquid medium is used regardless whether one or more solvents are present.

The term "low-reflectance" with respect to an electrode, means that the reflectance of the free-standing electrode in air is less than 30% in the spectral region of 380-780 nm.

The term "photoactive" is intended to mean to any material that exhibits electroluminescence or photosensitivity.

The term "pixel" is intended to mean the smallest complete, repeating unit of an array. The term "subpixel" is intended to mean a portion of a pixel that makes up only a part, but not all, of a pixel. In a full-color display, a full-color pixel can comprise three sub-pixels with primary colors in red, green and blue spectral regions. A "pixelated display" is divided into pixels that are small enough so that they are not distinguishable individually by the human eye.

The term "red" is intended to mean radiation that has an emission maximum at a wavelength in a range of approximately 580-700 nm.

The term "small molecule," when referring to a compound, is intended to mean a compound which does not have repeating monomeric units. In one embodiment, a small molecule has a molecular weight no greater than approximately 2000 g/mol.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited in case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Electronic Device

OLED devices generally include several layers between electrical contact layers, which are an anode and a cathode. These layers can include a hole-injection layer, a hole transport layer, a photoactive layer, an electron transport layer, and an electron-injection layer. The photoactive layer is pixilated with subpixels emitting different colors. In some embodiments, the subpixels are red light-emitting, green light-emitting, and blue light-emitting. These layers can be arranged in different configurations.

One configuration is a bottom-emitting configuration, as shown in FIG. 1. Substrate 100 is light-transmitting. Over this is positioned, in order, a transparent anode 101, a hole-injection layer 102, a hole transport layer 103, a photoactive layer 104, an electron transport layer 105, and a cathode 106. Light emission 150 is through the anode and substrate.

Figure 2:
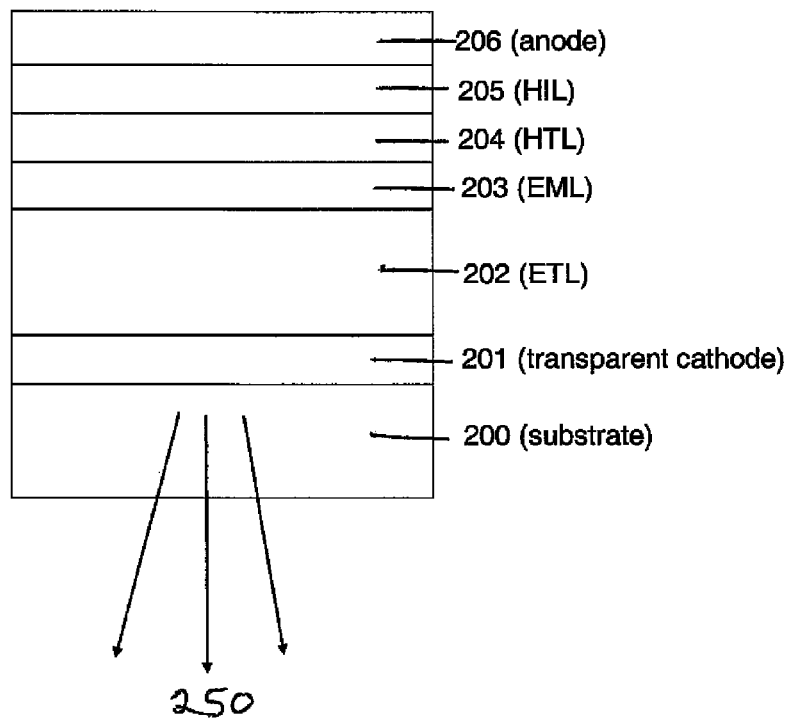
FIG. 2 includes an illustration of another example of an organic electronic device.

Another configuration is an inverted bottom-emitting configuration, as shown in FIG. 2. Substrate 200 is light-transmitting. Over this is positioned, in order, a transparent cathode 201, an electron transport layer 202, a photoactive layer 203, a hole transport layer 204, a hole-injection layer 205, and an anode 206. Light emission 250 is through the cathode and substrate.

Figure 3:
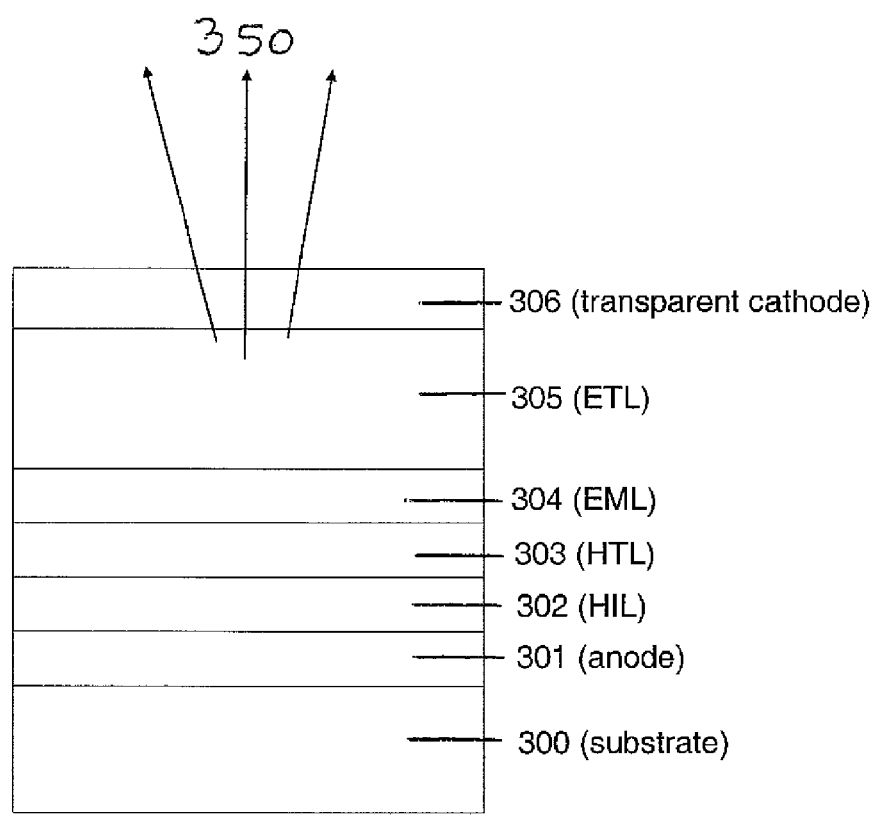
FIG. 3 includes an illustration of another example of an organic electronic device.

Another configuration is a top-emitting configuration, as shown in FIG. 3. Substrate 300 is not light-transmitting. Over this is positioned, in order, an anode 301, a hole-injection layer 302, a hole transport layer 303, a photoactive layer 304, an electron transport layer 305, and a transparent cathode 306. Light emission 350 is through the cathode.

Figure 4:
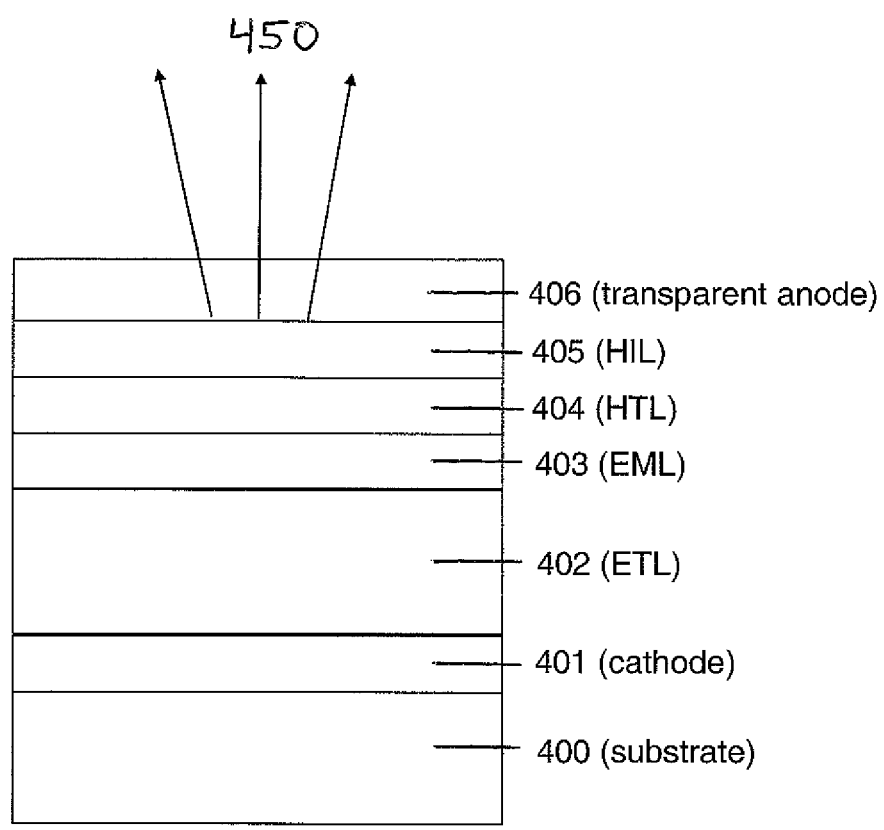
FIG. 4 includes an illustration of another example of an organic electronic device.

Another configuration is an inverted top-emitting configuration, as shown in FIG. 4. Substrate 400 is not light-transmitting. Over this is positioned, in order, a cathode 401, an electron transport layer 402, a photoactive layer 403, a hole transport layer 404, a hole-injection layer 405, and a transparent anode 406. Light emission 450 is through the anode.

Usually a non-transparent metal such as Al or Ag is used for either the anode (206 of FIG. 2 and 301 of FIG. 3) or cathode (106 of FIG. 1 and 401 of FIG. 4). These metal electrodes are shiny and reflect light. Under ambient lighting conditions, the reflected light reduces the OLED display contrast ratio and degrades the viewing quality. In most cases, it is necessary to use a polarizer on the light-emitting surface in order to partially compensate for this deficiency. The polarizer adds weight and cost to the device, and results in decreased luminance and efficiency.

There is provided herein an organic electronic device comprising:
- an anode;
- a hole injection layer
- a hole transport layer;
- a photoactive layer comprising a plurality of first subpixels, a plurality of second subpixels and a plurality of third subpixels;
- an electron transport layer comprising an electron transport material and an n-dopant, the layer having a thickness greater than 50 nm; and
- a cathode,
- wherein one of the anode and cathode is light-transmitting and the other has low-reflectance.

Unexpectedly and surprisingly, it has been found that the combination of the doped electron transport layer having the specified thickness and the low-reflectance electrode results in several desirable properties: (1) the reflectivity of the device is reduced compared to devices using a thin electron transport layer for all three primary colors; (2) the reflectivity of the device is reduced compared to devices using an aluminum electrode for all three primary colors; (3) high device efficiencies are maintained for all three primary colors; (4) the device has low dark current and a high on/off ratio; and (5) the sensitivity of blue color emission to electron transport layer thickness variation is reduced.

a. Electron Transport Layer

The electron transport layer comprises an electron transport material and an n-dopant, the layer having a thickness greater than 50 nm. In some embodiments, the thickness is less than 500 nm. In some embodiments, the thickness is in the range of 75-400 nm; in some embodiments, 100-300 nm. In some embodiments, the electron transport layer consists essentially of electron transport material and an n-dopant. In some embodiments, the electron transport layer consists essentially of one or two electron transport materials and one or two n-dopants.

Electron transport materials are well known. The materials include, but are not limited to, metal chelated oxinoid compounds, including metal quinolates such as tris(8-hydroxyquinolato)aluminum (AlQ), bis(2-methyl-8-quinolinolato)(p-phenylphenolato) aluminum (BAlq), tetrakis-(8-hydroxyquinolato)hafnium (HfQ) and tetrakis-(8-hydroxyquinolato)zirconium (ZrQ); azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthroline derivatives such as 9,10-diphenylphenanthroline (DPA) and 2,9-dimethyl-4,7-diphenyl-1,10-phenanthroline (DDPA); triazines; fullerenes; and mixtures thereof.

In some embodiments, the electron transport material is selected from the group consisting of metal quinolates and phenanthroline derivatives.

N-dopant materials are well known. The n-dopants include, but are not limited to, Group 1 and 2 metals; Group 1 and 2 metal salts, such as LiF, CsF, and $Cs_2CO_3$; Group 1 and 2 metal organic compounds, such as Li quinolate; and molecular n-dopants, such as leuco dyes, metal complexes, such as $W_2(hpp)_4$ where hpp=1,3,4,6,7,8-hexahydro-2H-pyrimido-[1,2-a]-pyrimidine and cobaltocene, tetrathianaphthacene, bis(ethylenedithio)tetrathiafulvalene, heterocyclic radicals or diradicals, and the dimers, oligomers, polymers, dispiro compounds and polycycles of heterocyclic radical or diradicals.

In some embodiments, the n-dopant is a metal complex.

b. Low-Reflectance Electrode

Examples of materials for low-reflectance electrodes include, but are not limited to: metals, such as Sm; alloys, such as Sm/Ag; metal/organic mixtures, such as Ag and AlQ; metal/inorganic mixtures, such as SiO and Al; and oxygen-deficient ZnO. Also effective is the combination of a low-reflectance electrode and a light-absorbing charge transport layer, which can be organic, such as CuPc, or inorganic, such as calcium haxaboride and lanthanum nitride.

In some embodiments, the low-reflectance electrode is a cathode.

c. Other Device Layers

The anode is an electrode that is particularly efficient for injecting positive charge carriers. It can be made of, for example materials containing a metal, mixed metal, alloy, metal oxide or mixed-metal oxide, or it can be a conducting polymer, and mixtures thereof. Suitable metals include the Group 11 metals, the metals in Groups 4, 5, and 6, and the Group 8-10 transition metals. If the anode is to be light-transmitting, mixed-metal oxides of Groups 12, 13 and 14 metals, such as indium-tin-oxide, are generally used. The anode may also comprise an organic material such as polyaniline as described in "Flexible light-emitting diodes made from soluble conducting polymer," Nature vol. 357, pp 477 479 (11 Jun. 1992). At least one of the anode and cathode should be at least partially transparent to allow the generated light to be observed.

The hole injection layer comprises hole injection material. Hole injection materials are generally electrically conductive or semiconductive materials and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Hole injection materials may be polymers, oligomers, or small molecules, and may be in the form of solutions, dispersions, suspensions, emulsions, colloidal mixtures, or other compositions.

The hole injection layer can be formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like. The hole injection layer can comprise charge transfer compounds, and the like, such as copper phthalocyanine and the tetrathiafulvalene-tetracyanoquinodimethane system (TTF-TCNQ). In one embodiment, the hole injection layer is made from a dispersion of a conducting polymer and a colloid-forming polymeric acid. Such materials have been described in, for example, published U.S. patent applications 2004-0102577, 2004-0127637, and 2005/205860.

The hole transport layer comprises hole transport material. Examples of hole transport materials for the hole transport layer have been summarized for example, in Kirk-Othmer Encyclopedia of Chemical Technology, Fourth Edition, Vol. 18, p. 837-860, 1996, by Y. Wang. Both hole transporting small molecules and polymers can be used. Commonly used hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 4,4'-bis(carbazol-9-yl)biphenyl (CBP); 1,3-bis(carbazol-9-yl)benzene (mCP); 1,1-bis[(di-4-tolylamino) phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl] (4-methylphenyl)methane (MPMP); 1-phenyl-3-[p-(diethylamino)styryl]-5-[p-(diethylamino)phenyl] pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis (naphthalen-1-yl)-N,N'-bis-(phenyl)benzidine (α-NPB); and porphyrinic compounds, such as copper phthalocyanine. Commonly used hole transporting polymers include, but are not limited to, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate. In some cases, triarylamine polymers are used, especially triarylamine-fluorene copolymers. In some cases, the polymers and copolymers are crosslinkable. Examples of crosslinkable hole transport polymers can be found in, for example, published US patent application 2005-0184287 and published PCT application WO 2005/052027.

In some embodiments, the photoactive layer comprises an organic electroluminescent ("EL") material. Any EL material can be used in the devices, including, but not limited to, small molecule organic fluorescent compounds, fluorescent and phosphorescent metal complexes, conjugated polymers, and mixtures thereof. Examples of fluorescent compounds include, but are not limited to, pyrene, perylene, rubrene, coumarin, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly (phenylenevinylenes), polyfluorenes, poly(spirobifluorenes), polythiophenes, poly(p-phenylenes), copolymers thereof, and mixtures thereof.

The cathode is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used. Li-containing organometallic compounds, LiF, and $Li_2O$ can also be deposited between the organic layer and the cathode layer to lower the operating voltage. This layer may be referred to as an electron injection layer.

It is known to have other layers in organic electronic devices. For example, there can be a layer (not shown) between the anode and hole injection layer to control the amount of positive charge injected and/or to provide bandgap matching of the layers, or to function as a protective layer. Layers that are known in the art can be used, such as copper phthalocyanine, silicon oxy-nitride, fluorocarbons, silanes, or an ultra-thin layer of a metal, such as Pt. Alternatively, some or all of the anode layer, the cathode layer, and the active layers between these layers, can be surface-treated to increase charge carrier transport efficiency. The choice of materials for each of the component layers is preferably determined by balancing the positive and negative charges in the emitter layer to provide a device with high electroluminescence efficiency.

It is understood that each functional layer can be made up of more than one layer.

In one embodiment, the different layers have the following range of thicknesses: anode, 500-5000 Å, in one embodiment 1000-2000 Å; hole injection layer, 50-2000 Å, in one embodiment 200-1000 Å; hole transport layer, 50-2000 Å, in one embodiment 200-1000 Å; photoactive layer, 10-2000 Å, in one embodiment 100-1000 Å; electron transport layer, 50-500 Å, in one embodiment 100-300 Å; cathode, 200-10000 Å, in one embodiment 300-5000 Å. The desired ratio of layer thicknesses will depend on the exact nature of the materials used.

The device layers can be formed by any deposition technique, or combinations of techniques, including vapor deposition, liquid deposition, and thermal transfer. Substrates such as glass, plastics, and metals can be used. Conventional vapor deposition techniques can be used, such as thermal evaporation, chemical vapor deposition, and the like. The organic layers can be applied from solutions or dispersions in suitable solvents, using conventional coating or printing techniques, including but not limited to spin-coating, dip-coating, roll-to-roll techniques, ink-jet printing, continuous nozzle printing, screen-printing, gravure printing and the like.

In some embodiments, the device is fabricated by liquid deposition of the buffer layer, the hole transport layer, and the photoactive layer, and by vapor deposition of the anode, the electron transport layer, an electron injection layer and the cathode.

It is understood that the efficiency of devices made with the new compositions described herein, can be further improved by optimizing the other layers in the device. For example, more efficient cathodes such as Ca, Ba or LiF can be used. Shaped substrates and novel hole transport materials that result in a reduction in operating voltage or increase quantum efficiency are also applicable. Additional layers can also be added to tailor the energy levels of the various layers and facilitate electroluminescence.

EXAMPLES

The concepts described herein will be further described in the following examples, which do not limit the scope of the invention described in the claims.

Materials hole injection material=HIJ-1, which is made from an aqueous dispersion of an electrically conductive polymer and a polymeric fluorinated sulfonic acid. Such materials have been described in, for example, published U.S. patent applications US 2004/0102577, US 2004/0127637, and US 2005/0205860.

hole transport material=NPB

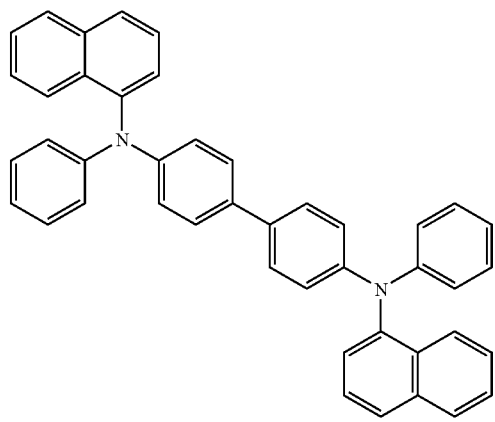 [SMILES: c1ccc(N(c2ccc(-c3ccc(N(c4ccccc4)c4cccc5ccccc45)cc3)cc2)c2cccc3ccccc23)cc1]

electron transport material=a metal quinolate complex

Emitter 1

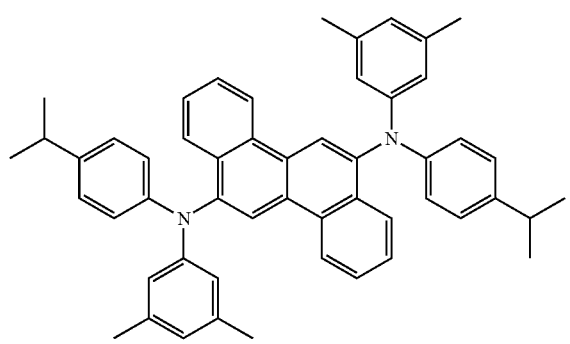

Emitter 2

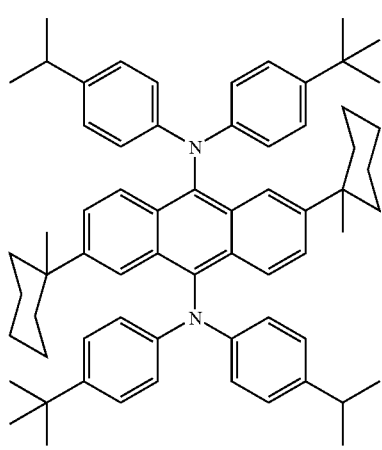

Emitter 3

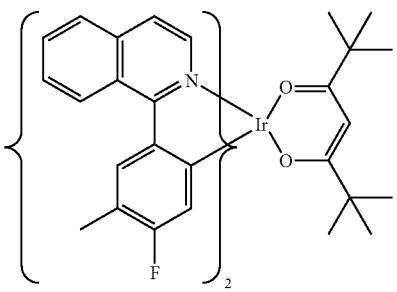

Host 1

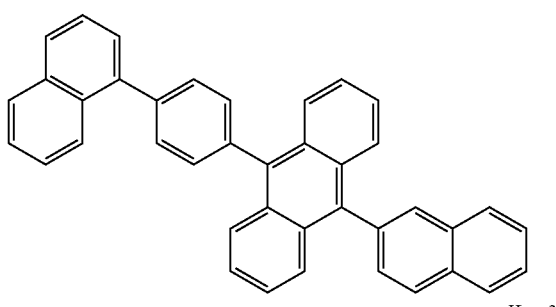

Host 2

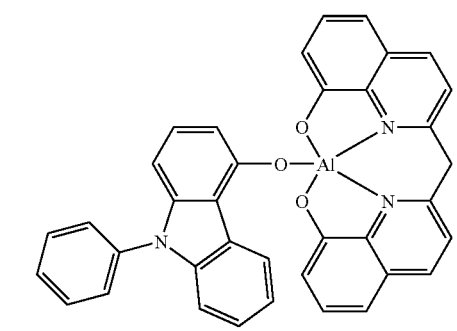

n-Dopant 1

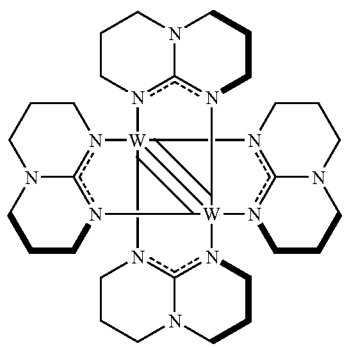

W₂(hpp)₄

Examples 1-3

These examples illustrate the optical properties of devices as determined by ETFOS calculation.

Basic device structures were based on the "blue all-over" display design, where the green and red pixels are deposited pattern wise and the blue color is blank deposited without patterning. This design reduces the complexity involved in patterning all three primary colors. Device structures used for computation are listed below, where "ETL" represents electron transport layer.

Blue:
ITO (50 nm)/HIJ-1 (25 nm)/NPB (30 nm)/emitter 1 (2.4 nm) in host 1 (30 nm)/ETL (10 nm)/n-doped ETL (variable)/LiF (1 nm)/Al (100 nm) or Sm (100 nm)

Green:
ITO (50 nm)/HIJ-1 (25 nm)/NPB (30 nm)/emitter 2 (3.2 nm) in host 1 (40 nm)/emitter 1 (2.4 nm) in host 1 (30 nm)/ETL (10 nm)/n-doped ETL (variable)/LiF (1 nm)/Al (100 nm) or Sm (100 nm)

Red:
ITO (50 nm)/DB (25 nm)/NPB (30 nm)/emitter 3 (3.2 nm) in host 2 (40 nm)/emitter 1 (2.4 nm) in host 1 (30 nm)/ETL (10 nm)/n-doped ETL (variable)/LiF (1 nm)/Al (100 nm) or Sm (100 nm)

The computation was carried out with the well-established Emissive Thin Film Optics Simulation (ETFOS) program, commercially available from Zurich University of Applied Sciences. The ETL thickness in the examples represents the sum of the un-doped and n-doped ETL thickness.

The reflectivity of the device can be measured quantitatively by a quantity called Luminous Reflectance, LR, defined as $$LR = \frac{\int_{380\,nm}^{780\,nm} P(\lambda)V(\lambda)R(\lambda)\,d\lambda}{\int_{380\,nm}^{780\,nm} P(\lambda)V(\lambda)\,d\lambda}$$

where $P(\lambda)$ is the photopic function according to 1988 CIE standard, $V(\lambda)$ is the D65 illuminant spectra to simulate sunlight, and $R(\lambda)$ is the reflectance spectra obtained either by measurement or through computation.

Devices were fabricated with the typical OLED fabrication equipments.

Comparative Example A

Figure 5:
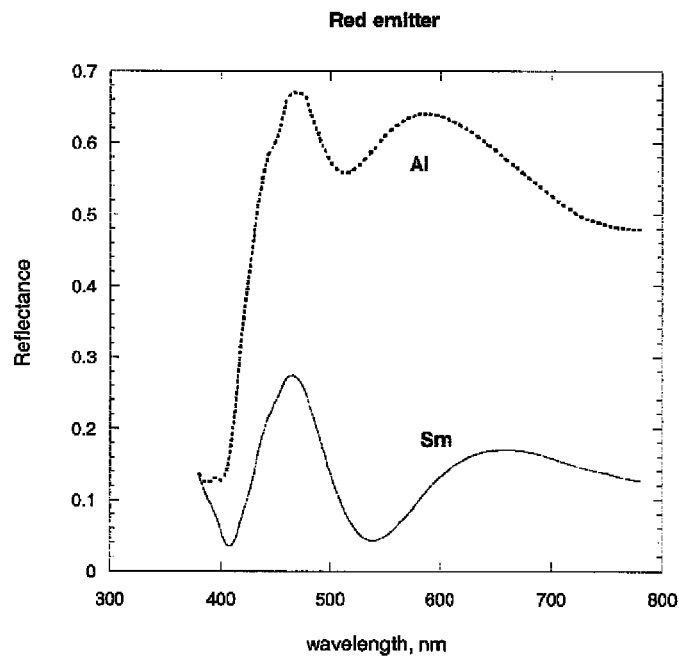
FIG. 5 includes a graph of reflectance spectra for red test devices.
Figure 6:
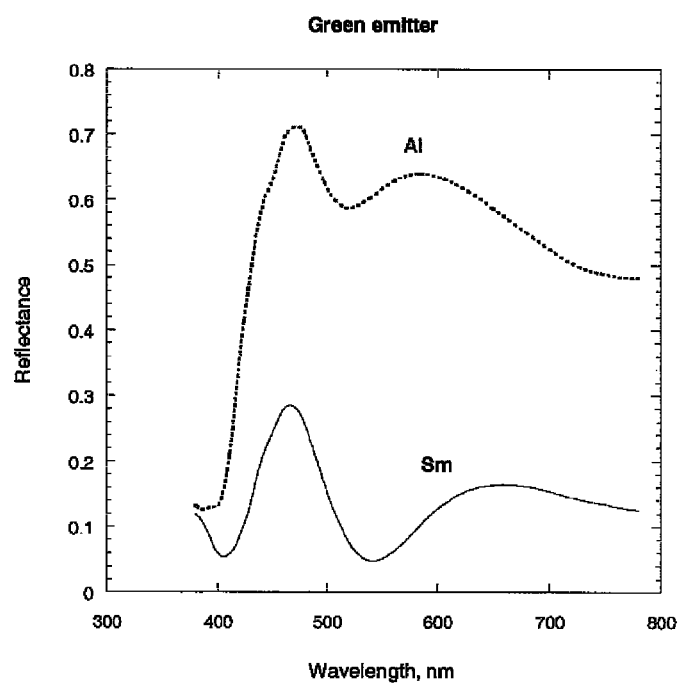
FIG. 6 includes a graph of reflectance spectra for green test devices.
Figure 7:
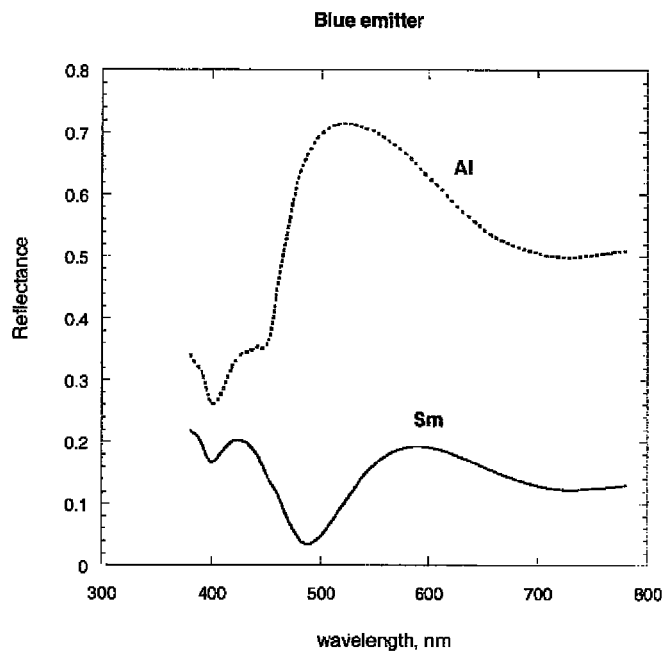
FIG. 7 includes a graph of reflectance spectra for blue test devices.

The reflectance of RGB pixels with the test device structures were first computed using Al as the cathode and a common metal quinolate ETL thickness of 160 nm. The reflectance spectra from 380 nm-780 nm are shown in FIGS. 5, 6, and 7 (dotted lines) for red, green, and blue, respectively. The reflectance is generally in the 50-80% range due to the shining Al metal.

Example 1

The reflectance of RGB pixels with the test device structures were computed using Sm as the cathode and a common metal quinolate ETL thickness of 160 nm. The reflectance spectra from 380 nm-780 nm are shown in FIGS. 5, 6, and 7 (solid lines) for red, green, and blue, respectively. Clearly, there is an order-of-magnitude reduction in reflectivity from Al to Sm cathode due to the low-reflectance of Sm metal and the use of thick ETL.

Comparative Example B

Figure 8:
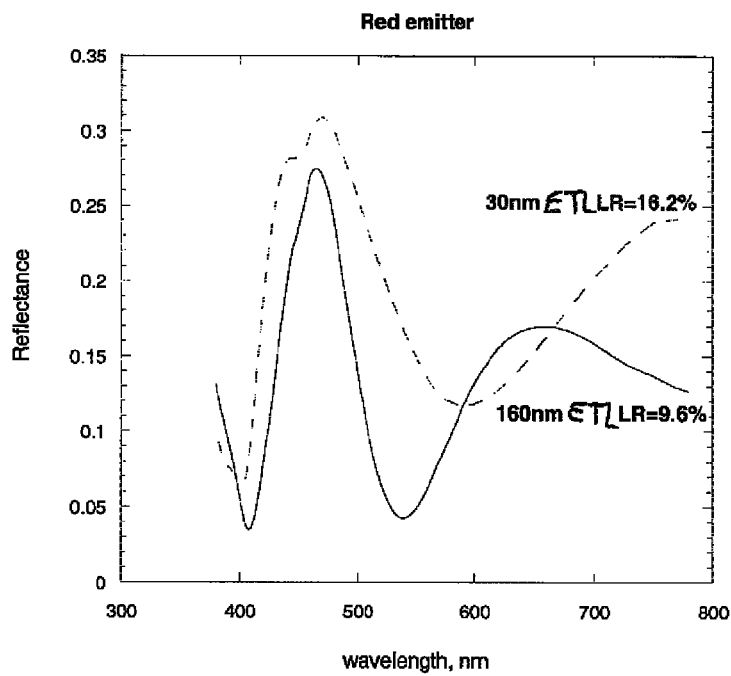
FIG. 8 includes a graph of reflectance spectra for red test devices.
Figure 9:
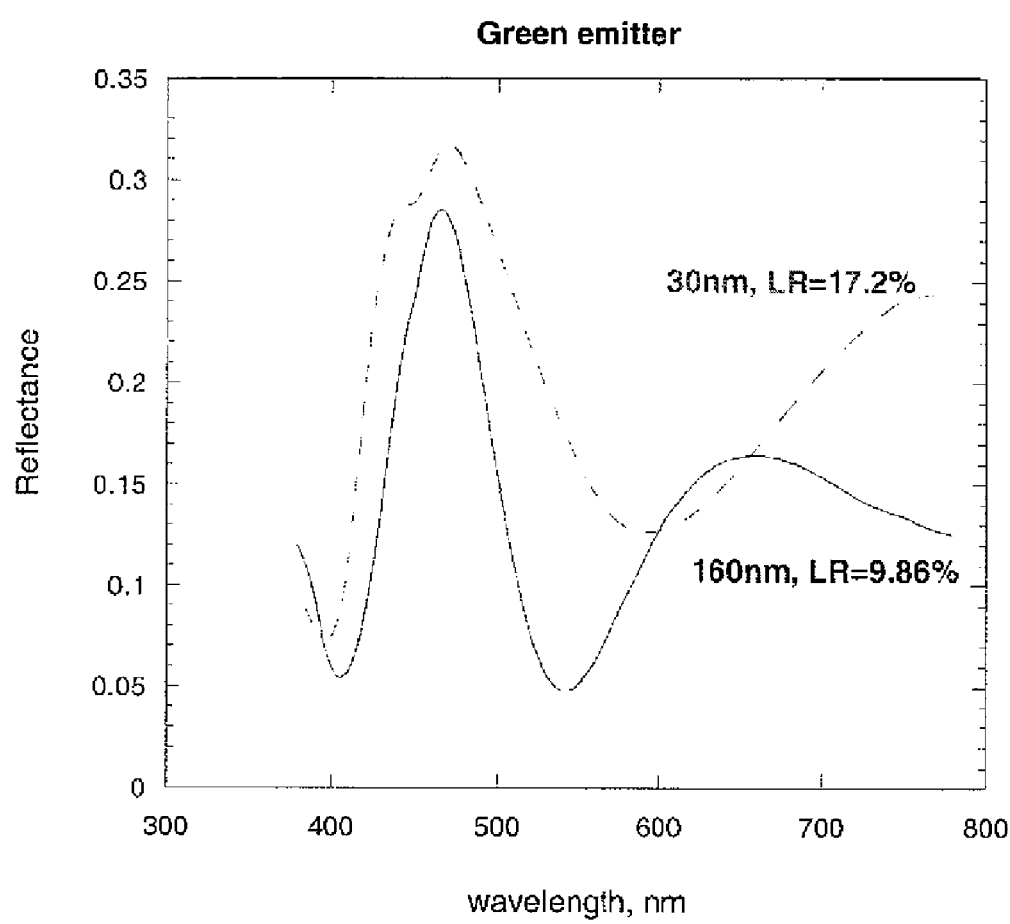
FIG. 9 includes a graph of reflectance spectra for green test devices.
Figure 10:
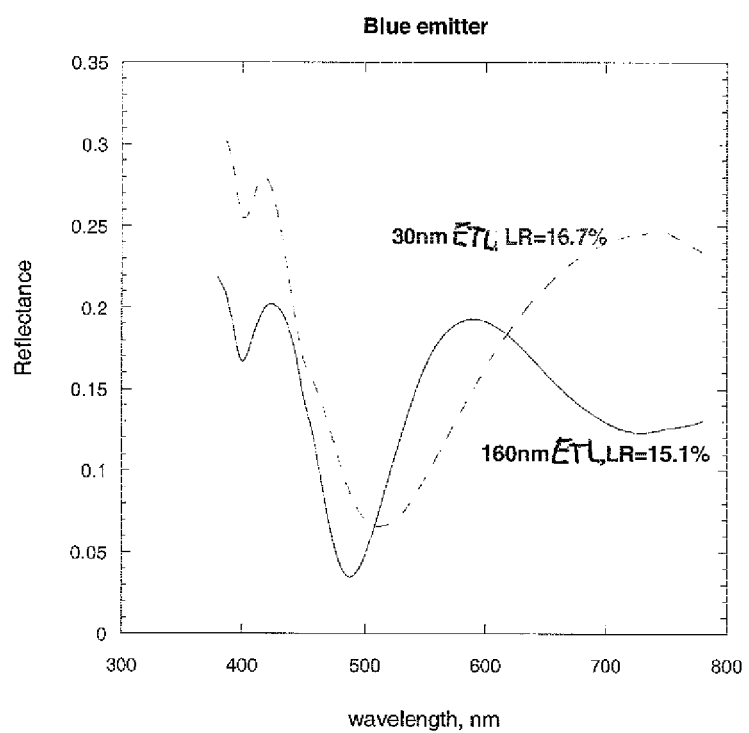
FIG. 10 includes a graph of reflectance spectra for blue test devices.

The reflectance spectra of the test device structures were computed using Sm as the cathode and thin (30 nm) metal quinolate as the ETL as shown in FIGS. 8, 9, and 10 (dashed lines). The luminous reflectance of the red, green, and blue pixels were calculated as 16.2%, 17.2%, and 16.7% respectively.

Example 2

The reflectance spectra of the test device structures were computed using Sm as the cathode and thick (160 nm) metal quinolate as the ETL as shown in FIGS. 8, 9, and 10 (solid lines). The luminous reflectance of the red, green, and blue pixels were calculated as 9.6%, 9.86%, and 15.1% respectively. These results demonstrate the reflectivity of the device can be reduced by the use of thick ETL and low-reflectance electrode.

Comparative Example C

Figure 11:
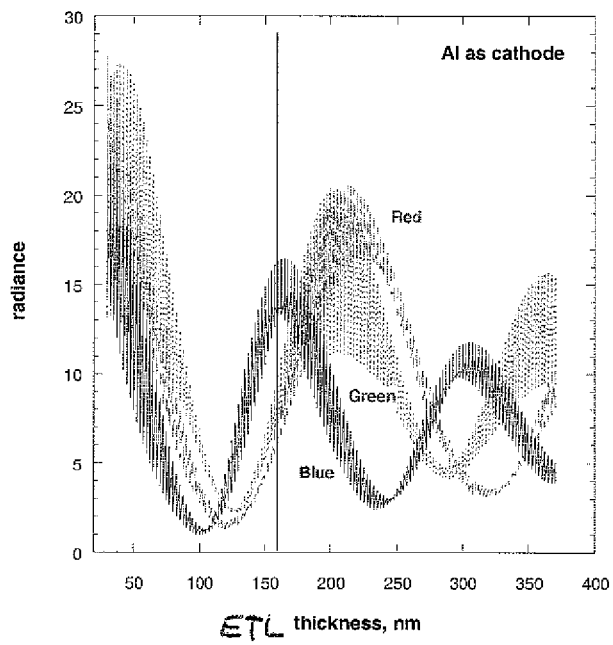
FIG. 11 includes a graph of radiance as a function of electron transport layer thickness.

The radiances of the test device structures were computed for all three color pixels at a common ETL thickness of 160 nm using Al as the cathode. Radiance can be correlated to efficiency for a given color. FIG. 11 shows plots of radiance vs. ETL thickness for blue, red and green. The relative efficiency of red, green, and blue varies as the ETL thickness is varied. To fabricate a color display, an ETL thickness common to all three colors have to be chosen to get the best compromised efficiencies for all three colors. For ETL thickness of 160 nm, relatively high blue efficiency and reasonable green and red efficiency can be obtained. Table I shows the relative efficiencies for all three colors with ETL thickness at 160 nm.

The relative efficiency is ratioed to the peak efficiency for each color. For example, for blue pixels, the peak radiance is 15.4 and the radiance at 160 nm ETL is 14.1 which gives it a relative efficiency of 0.92.

Also shown in Table I is the relative efficiency with the addition of polarizers ("Al+FP"). Because Al cathode is very reflective, polarizers have to be used to remove the reflection under ambient light which typically reduce the efficiency by half.

Example 3

Figure 12:
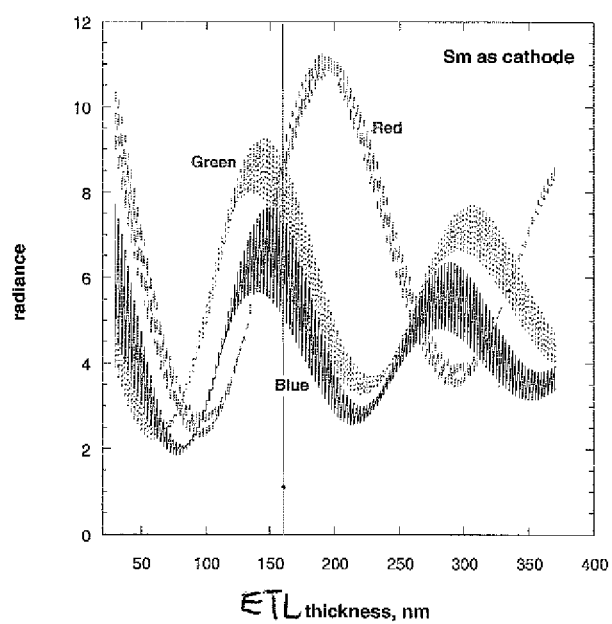
FIG. 12 includes a graph of radiance as a function of electron transport layer thickness.

The radiances of the test device structures are computed for all three color pixels at a common ETL thickness of 160 nm using Sm as the cathode. FIG. 12 shows plots of radiance vs. ETL thickness for blue, red and green. At ETL thickness of 160 nm, relatively high blue efficiency and reasonable green and red efficiency can be obtained. Table I shows the relative efficiencies for all three colors with ETL thickness at 160 nm. For comparison purpose, the relative efficiency is ratioed to the peak efficiency of Al cathode in Comparative Example C for each color. Because of the low reflectivity of devices made with thick electron transport layer and Sm cathode, the use of polarizers can be eliminated. As shown in Table I, although the efficiencies of Sm-based devices may be smaller or larger than Al-based devices, they are all higher than Al-based devices with polarizers.

TABLE I

Comparison of RGB performance of a "blue all-over" display design using Al vs Sm as the cathode.

| | Blue | | | Green | | | Red | | |
|---|---|---|---|---|---|---|---|---|---|
| | Al | Al + P | Sm | Al | Al + P | Sm | Al | Al + P | Sm |
| Efficiency | 0.92 | 0.46 | 0.48 | 0.53 | 0.27 | 0.47 | 0.34 | 0.17 | 0.46 |
| color | (0.134, 0.084) | | (0.127, 0.161) | (0.17, 0.66) | | (0.32, 0.62) | (0.63, 0.35) | | (0.65, 0.34) |

Examples 4-5

These examples illustrate color and I-V properties of devices. The devices were prepared with the materials described above. The hole injection layer was formed by spin-coating. All other layers were formed by vapor deposition.

Comparative Example D

Figure 13:
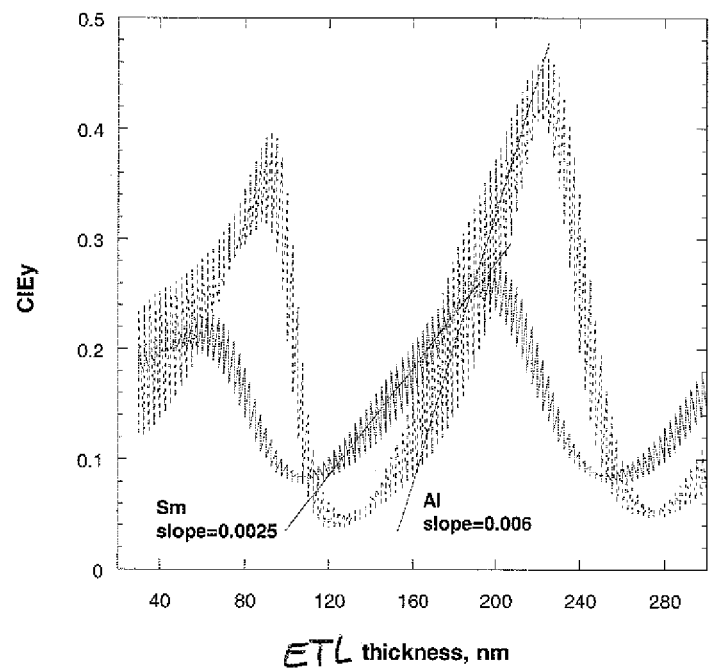
FIG. 13 includes a graph of CIE y values as a function of electron transport layer thickness.

FIG. 13 shows the CIEy value of the blue test structure using Al as the cathode plotted as a function of ETL thickness (dotted line). The CIEy value was very sensitive to minor variation of the ETL thickness. This large color sensitivity presents a difficult problem during the manufacturing. The color sensitivity can be represented quantitatively by the slope of the plot, which is 0.006 in the 160 nm to 220 nm ETL thickness region.

Example 4

Figure 14:
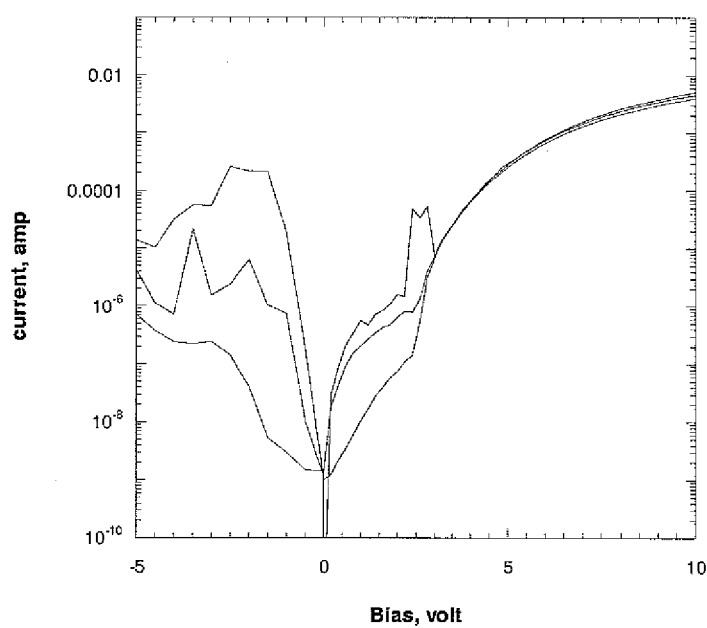
FIG. 14. includes a graph of I-V curves for a blue test device.

FIG. 13 also shows the CIEy value of the blue test structure using Sm as the cathode plotted as a function of ETL thickness. As can be seen, the color sensitivity problem was greatly reduced. In the ETL thickness region from 120 nm to 190 nm, the slope was 0.0025 which is about a factor of 2.4 smaller than comparative example D using an Al cathode. The smaller color sensitivity is an important advantage during manufacturing for thick ETL+Sm architecture of this invention Comparative Example E FIG. 14 shows the I-V curve of a blue test device using 20 nm thin metal quinolate as ETL and LiF/Al cathode. There was a lot of scatter at reverse bias. At a reverse bias voltage of −5V, the current was ~2.8×10$^{-6}$ A. At a forward bias voltage of 5 V, the current was 2.8×10$^{-4}$ A, resulting in an on/off ratio of ~100.

Example 5

Figure 15:
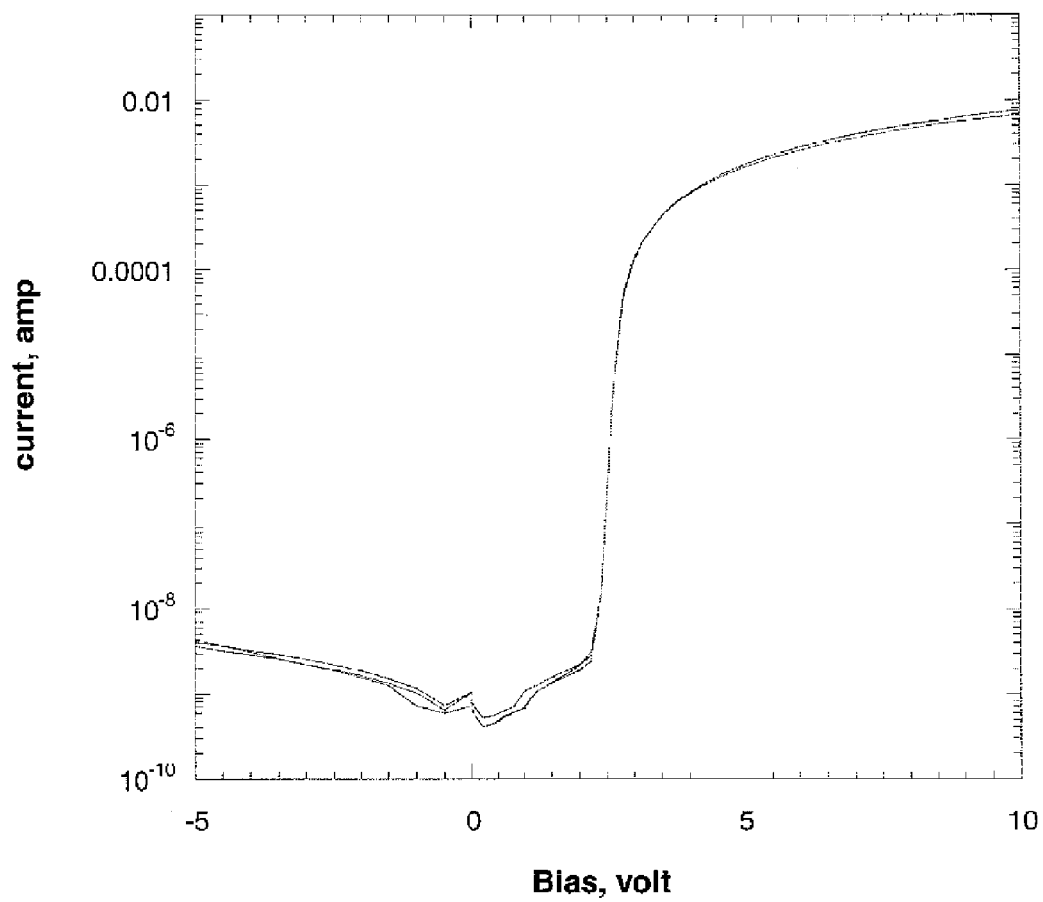
FIG. 15. includes a graph of I-V curves for a blue test device.

FIG. 15 shows the I-V curve of a blue test device using 140 nm thick ETL made of metal quinolate doped with dopant 1 and Al cathode. At a reverse bias voltage of −5V, the current was 3.8×10$^{-9}$ A. At a forward bias voltage of 5 V, the current was 1.6×10$^{-3}$ A, resulting in an on/off ratio of 4.2×10$^5$. The on/off ratio of the blue device was significantly higher with the thick doped ETL layer. A higher on/off ratio lessens the probability of shorting and improves manufacturing yield.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

What is claimed is:

1. An organic electronic device comprising:
   an anode;
   a hole injection layer
   a hole transport layer;
   a photoactive layer comprising a plurality of first subpixels, a plurality of second subpixels and a plurality of third subpixels;
   an electron transport layer comprising an electron transport material and an n-dopant, the layer having a thickness greater than 50 nm; and
   a cathode,
   wherein one of the anode and cathode is light-transmitting and the other has low-reflectance.

2. The device of claim 1, wherein the anode is light-transmitting and the cathode has low-reflectance.

3. The device of claim 2, wherein the cathode comprises a material selected from the group consisting of Sm, Sm/Ag alloys, metal/organic mixtures, metal/inorganic mixtures, and oxygen deficient ZnO.

4. The device of claim 1, wherein the electron transport material is selected from the group consisting of metal quinolates and phenanthroline derivatives.

5. The device of claim 1, wherein the electron transport layer has a thickness in the range of 75-400 nm.

6. The device of claim 1, wherein the electron transport layer has a thickness in the range of 100-300 nm.

7. The device of claim 1, wherein the n-dopant is selected from the group consisting of Group 1 and 2 metals; Group 1 and 2 metal salts; Group 1 and 2 metal organic compounds;

leuco dyes; metal complexes; tetrathianaphthacene; bis(ethylenedithio)tetrathiafulvalene; heterocyclic radicals or diradicals; and the dimers, oligomers, polymers, dispiro compounds and polycycles of heterocyclic radical or diradicals.

8. The device of claim 7, wherein the metal complex is selected from the group consisting of $W_2(hpp)_4$ and cobaltocene, where hpp=1,3,4,6,7,8-hexahydro-2H-pyrimido-[1,2-a]-pyrimidine.

9. The device of claim 1, wherein the electron transport layer has a thickness of 300 to 500 nm.

* * * * *